United States Patent
Takahashi et al.

(10) Patent No.: US 9,306,500 B2
(45) Date of Patent: Apr. 5, 2016

(54) CASCODE AMPLIFIER

(71) Applicant: Mitsubishi Electric Corporation, Tokyo (JP)

(72) Inventors: Yoshinori Takahashi, Tokyo (JP); Miyo Miyashita, Tokyo (JP); Kazuya Yamamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 17 days.

(21) Appl. No.: 14/462,625

(22) Filed: Aug. 19, 2014

(65) Prior Publication Data
US 2015/0171794 A1 Jun. 18, 2015

(30) Foreign Application Priority Data

Dec. 16, 2013 (JP) ................................. 2013-259217

(51) Int. Cl.
*H03F 1/22* (2006.01)
*H03F 1/02* (2006.01)
*H03F 3/195* (2006.01)
*H03F 3/24* (2006.01)

(52) U.S. Cl.
CPC .............. *H03F 1/0211* (2013.01); *H03F 1/223* (2013.01); *H03F 3/195* (2013.01); *H03F 3/245* (2013.01); *H03F 2200/18* (2013.01)

(58) Field of Classification Search
CPC ............ H03F 1/22; H03F 1/223; H03F 1/226
USPC ........................................................ 330/311
See application file for complete search history.

(56) References Cited

U.S. PATENT DOCUMENTS

| 8,106,711 | B2 | 1/2012 | Adamski et al. |
| 2010/0060362 | A1 | 3/2010 | Kanaya et al. |
| 2011/0095826 | A1 | 4/2011 | Hadjichristos et al. |
| 2013/0141168 | A1 | 6/2013 | Nozaki et al. |
| 2014/0184337 | A1* | 7/2014 | Nobbe .................. H03F 1/0227 330/296 |

FOREIGN PATENT DOCUMENTS

| JP | 59-228475 A | 12/1984 |
| JP | 3-72704 A | 3/1991 |
| JP | 3-240306 A | 10/1991 |
| JP | 2003-347867 A | 12/2003 |

(Continued)

OTHER PUBLICATIONS

Teeter et al.; "Average Current Reduction in (W) CDMA Power Amplifiers", *IEEE Radio Frequency Integrated Circuits Symposium*, (2006).

(Continued)

*Primary Examiner* — Steven J Mottola
(74) *Attorney, Agent, or Firm* — Leydig, Voit & Mayer, Ltd.

(57) ABSTRACT

A cascode amplifier includes: a first transistor having a gate to which a signal is input, a grounded source, and a drain; a second transistor having a gate, a source connected to the drain of the first transistor, and a drain; a load connected to the drain of the second transistor; a DC-DC converter supplying a supply voltage, which is variable according to output power, to the drain of the second transistor via the load; and a first bias circuit supplying a voltage, which is a function of the supply voltage, to the gate of the second transistor.

8 Claims, 5 Drawing Sheets

(56) References Cited

FOREIGN PATENT DOCUMENTS

| | | |
|---|---|---|
| JP | 2012-527853 A | 8/2012 |
| KR | 10-2010-0031061 A | 3/2010 |

OTHER PUBLICATIONS

Korean Patent Office; Office Action in Korean Patent Application No. 10-2014-0175592 (Oct. 15, 2015).

\* cited by examiner

CASCODE AMPLIFIER

BACKGROUND OF THE INVENTION

1. Field of the Invention

The present invention relates to a cascode amplifier made up of silicon CMOS of relatively low manufacturing cost, and more particularly, to a cascode amplifier with an expanded range of supply voltage control and capable of preventing deterioration of power added efficiency.

2. Background Art

Elements using processes of GaAs HBT or the like of good high-frequency characteristics and a high withstand voltage are generally used for high output amplifiers for amplification of transmission signals used for mobile communication devices such as mobile phones. High output amplifiers manufactured through these processes are designed to achieve maximum power added efficiency at maximum output power and the power added efficiency drastically deteriorates when output power decreases. A method of preventing efficiency deterioration when output power decreases is available which controls a supply voltage of a high output amplifier using a DC-DC converter in accordance with output power (e.g., see Douglas A. Teeter, "Average Current Reduction in (W) CDMA Power Amplifiers", Radio Frequency Integrated Circuits (RFIC) Symposium, 2006).

Manufacturing costs of processes of GaAs HBT or the like are relatively high, and therefore high output amplifiers are also being developed which use silicon CMOS processes with relatively low manufacturing costs in volume production. In the case of a high output amplifier made up of CMOS, elements having high transistor high-frequency characteristics have a low withstand voltage, while elements having a high withstand voltage have lower high-frequency characteristics. Therefore, a high output amplifier is configured as a cascode amplifier, elements with a low withstand voltage and high high-frequency characteristics are used for source-grounded transistors and elements with a high withstand voltage and low high-frequency characteristics are used for gate-grounded transistors. A gate voltage of a gate-grounded transistor is set to a voltage at which a drain voltage of a source-grounded transistor does not exceed a withstand voltage.

SUMMARY OF THE INVENTION

In the case of a cascode amplifier made up of CMOS as well as an amplifier made up of GaAs HBT, it is also possible to prevent deterioration of power added efficiency when output power decreases by controlling the supply voltage using a DC-DC converter. However, since output impedance drastically changes at a point of operation at which a gate-grounded transistor transitions from saturation operation to linear operation, an output signal is distorted. For this reason, a lower limit down to which the supply voltage is reduced becomes the sum of the drain voltage of the source-grounded transistor, the saturated drain voltage of the gate-grounded transistor and an output amplitude margin.

To expand a range of supply voltage control, the drain voltage of the source-grounded transistor may be set to a lowest possible level. However, since the operation range of the drain voltage of the source-grounded transistor becomes insufficient when the output signal power increases, there is a problem that operation of the source-grounded transistor becomes linear operation, causing the output signal to be distorted.

In view of the above-described problems, an object of the present invention is to provide a cascode amplifier which can prevent deterioration of power added efficiency while expanding the range of supply voltage control.

According to the present invention, a cascode amplifier includes: a first transistor having a gate to which a signal is inputted, a grounded source, and a drain; a second transistor having a gate, a source connected to the drain of the first transistor, and a drain; a load connected to the drain of the second transistor; a DC-DC converter supplying a supply voltage which is variable according to output power to the drain of the second transistor via the load; and a first bias circuit supplying a voltage expressed by a function of the supply voltage to the gate of the second transistor. In the present invention, the first bias circuit that supplies a voltage expressed by a function of the supply voltage supplied from the DC-DC converter to the gate of the second transistor. Therefore, it is possible to prevent deterioration of power added efficiency while expanding the range of supply voltage control.

Other and further objects, features and advantages of the invention will appear more fully from the following description.

DETAILED DESCRIPTION OF THE PREFERRED EMBODIMENTS

A cascode amplifier according to the embodiments of the present invention will be described with reference to the drawings. The same components will be denoted by the same symbols, and the repeated description thereof may be omitted.

First Embodiment

Figure 1:
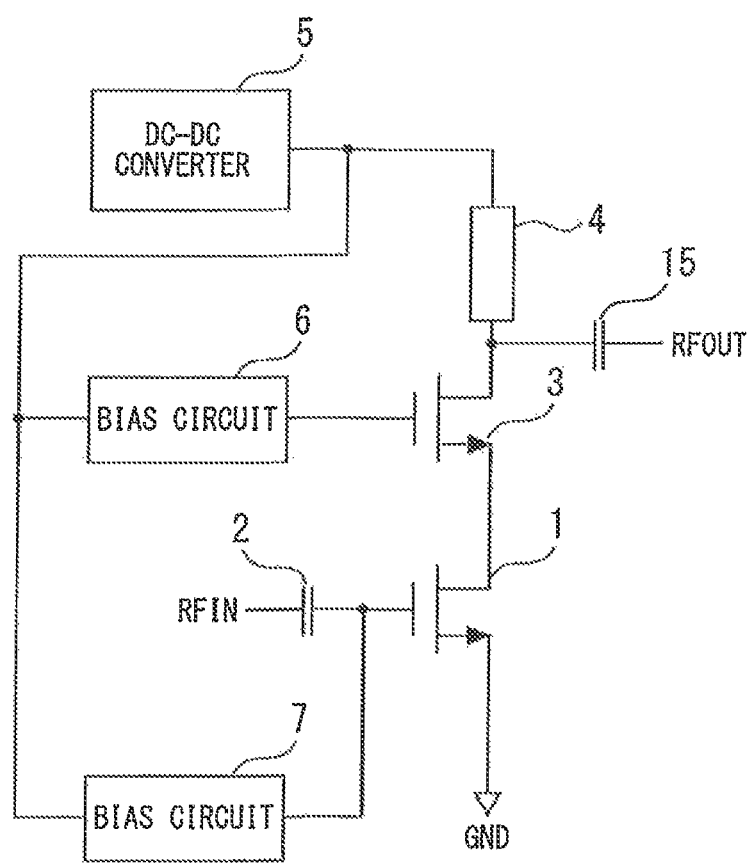
FIG. 1 is a diagram illustrating a cascode amplifier according to a first embodiment of the present invention.

FIG. 1 is a diagram illustrating a cascode amplifier according to a first embodiment of the present invention. A transistor 1 is a source-grounded transistor that has a gate, a grounded source and a drain. A signal is inputted to the gate of the transistor 1 via a DC cut capacitance 2.

A transistor 3 is a gate-grounded transistor that includes a gate, a source connected to the drain of the transistor 1 and a drain. A load 4 is connected to the drain of the transistor 3. A signal is outputted from the drain of the transistor 3 via a DC cut capacitance 15. The transistors 1 and 3 are silicon MOSFETs.

A DC-DC converter 5 supplies a supply voltage which is variable according to output power to the drain of the transistor 3 via the load 4. A bias circuit 6 supplies a voltage expressed by a function of the supply voltage to the gate of the transistor 3. A bias circuit 7 supplies a voltage expressed by a function of the supply voltage to the gate of the transistor 1.

More specifically, the output voltage of the bias circuit 6 increases so that the higher the supply voltage of the DC-DC converter 5, the higher the drain voltage of the transistor 1 becomes. Since a short-gate-length transistor with high-frequency performance is used as the transistor 1, if the drain voltage increases due to influences of a short channel effect, a bias current increases. Thus, the higher the supply voltage, the lower the output voltage of the bias circuit 7 becomes and the gate voltage of the transistor 1 decreases.

When the gate voltage of the transistor 1 is increased according to the supply voltage, the withstand voltage of the transistor 1 having excellent high-frequency characteristics is low. Thus, the bias circuit 6 limits the drain voltage of the transistor 1 so as not to exceed a certain voltage which does not exceed the withstand voltage of the transistor 1. The bias circuit 6 may also limit the drain voltage of the transistor 1 so as not to fall below a certain voltage.

Figure 2:
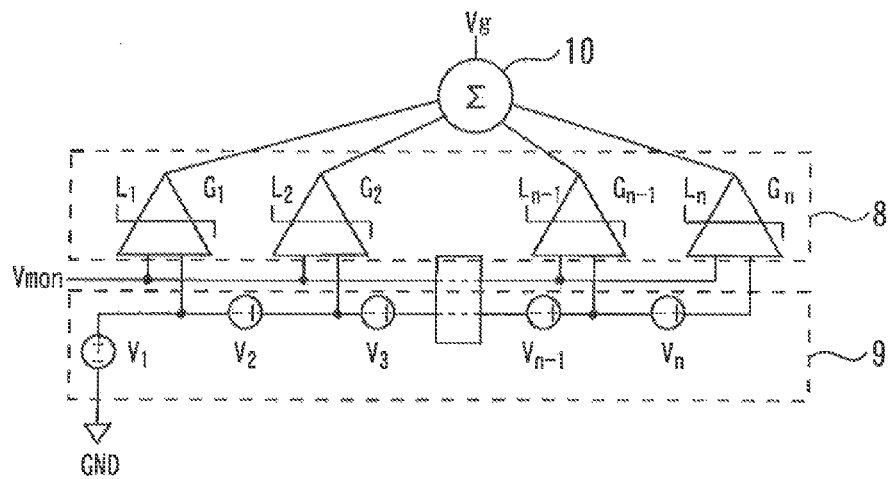
FIG. 2 is a diagram illustrating a bias circuit according to a first embodiment of the present invention.

FIG. 2 is a diagram illustrating a bias circuit according to a first embodiment of the present invention. A plurality of limiter amplifiers 8 include differential input terminals respectively. A monitor voltage Vmon (supply voltage) is inputted to first terminals of the differential input terminals of the plurality of limiter amplifiers 8. A plurality of reference voltage sources 9 supply reference voltages V1, ..., Vn to second terminals of the plurality of differential input terminals respectively. An adder 10 adds up outputs of the plurality of limiter amplifiers 8. Here, n limiter amplifiers are used. The plurality of limiter amplifiers 8 are controlled by difference voltages between the reference voltages V1, ..., Vn of the plurality of reference voltage sources 9 and the monitor voltage Vmon and output 0. to limiting levels L1, ..., Ln.

Figure 3:
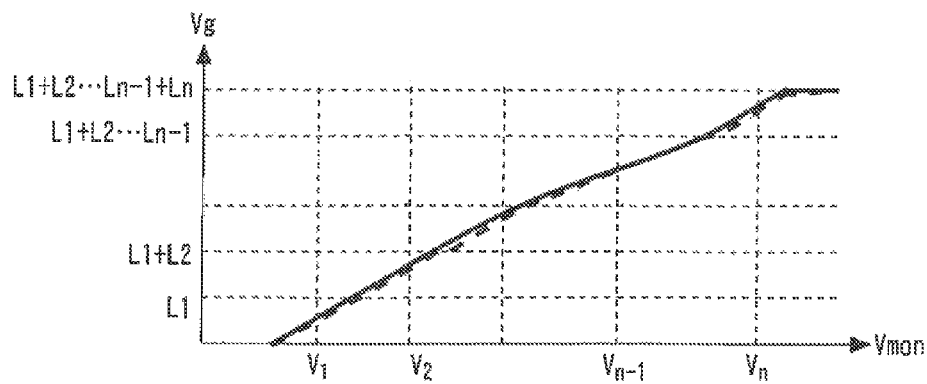
FIG. 3 is a diagram illustrating an output characteristic of the bias circuit of FIG. 2.

FIG. 3 is a diagram illustrating an output characteristic of the bias circuit of FIG. 2. It is possible to obtain an output characteristic of an any given function for the monitor voltage Vmon by appropriately setting the number of stages of the plurality of limiter amplifiers 8, reference voltages V1, ..., Vn, limiting levels L1, ..., Ln, and gains G1 ... Gn of the plurality of limiter amplifiers 8.

Note that although the output characteristic of FIG. 3 has a polygonal line shape, in the actual circuit, the plurality of limiter amplifiers 8 show such rising and limiting characteristics that rising and limiting operations take place smoothly. For this reason, the adder 10 also has a smooth output characteristic, unlike a polygonal line.

In the present embodiment, it is possible to prevent deterioration of power added efficiency while expanding the range of supply voltage control by using the bias circuit 6 that supplies a voltage expressed by a function of the supply voltage supplied from the DC-DC converter 5 to the gate of the transistor 3. Note that power added efficiency can be further improved using the bias circuit 7 that monitors the supply voltage and supplies an appropriate voltage to the gate of the transistor 1. The circuit may also be configured so that the function of the bias circuit 6 is changed according to an operating mode signal inputted from outside.

Second Embodiment

Figure 4:
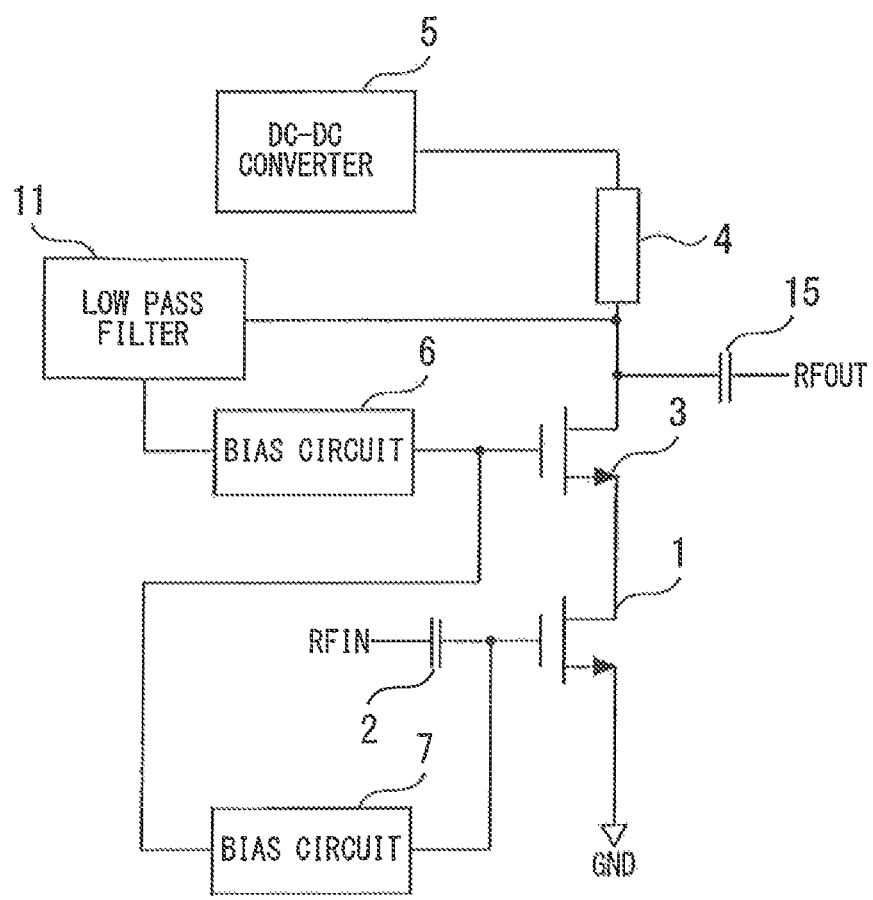
FIG. 4 is a diagram illustrating a cascode amplifier according to a second embodiment of the present invention.

FIG. 4 is a diagram illustrating a cascode amplifier according to a second embodiment of the present invention. A low pass filter 11 is connected between the input of the bias circuit 6 and the drain of the transistor 3. Furthermore, the bias circuit 7 supplies a voltage expressed by a function of the output voltage of the bias circuit 6 to the gate of the transistor 1.

Since it is difficult to integrate the cascode amplifier and the DC-DC converter 5 on the same chip, they are formed on different chips. Therefore, in the first embodiment, independent terminals to monitor the supply voltage are necessary, which may cause an increase of the chip size of the cascode amplifier and an increase of mounting area when the DC-DC converter 5 is combined. Thus, in the present embodiment, the input of the bias circuit 6 is connected to the drain of the transistor 3. This eliminates the necessity for providing additional terminals and can prevent the chip size and mounting area from increasing.

The bias circuit 7 supplies a voltage expressed by a function of the output voltage of the bias circuit 6 to the gate of the transistor 1 and the bias circuit 7 can thereby be configured with a relatively simple bias circuit even when the bias circuit 6 supplies a complicated function.

Third Embodiment

Figure 5:
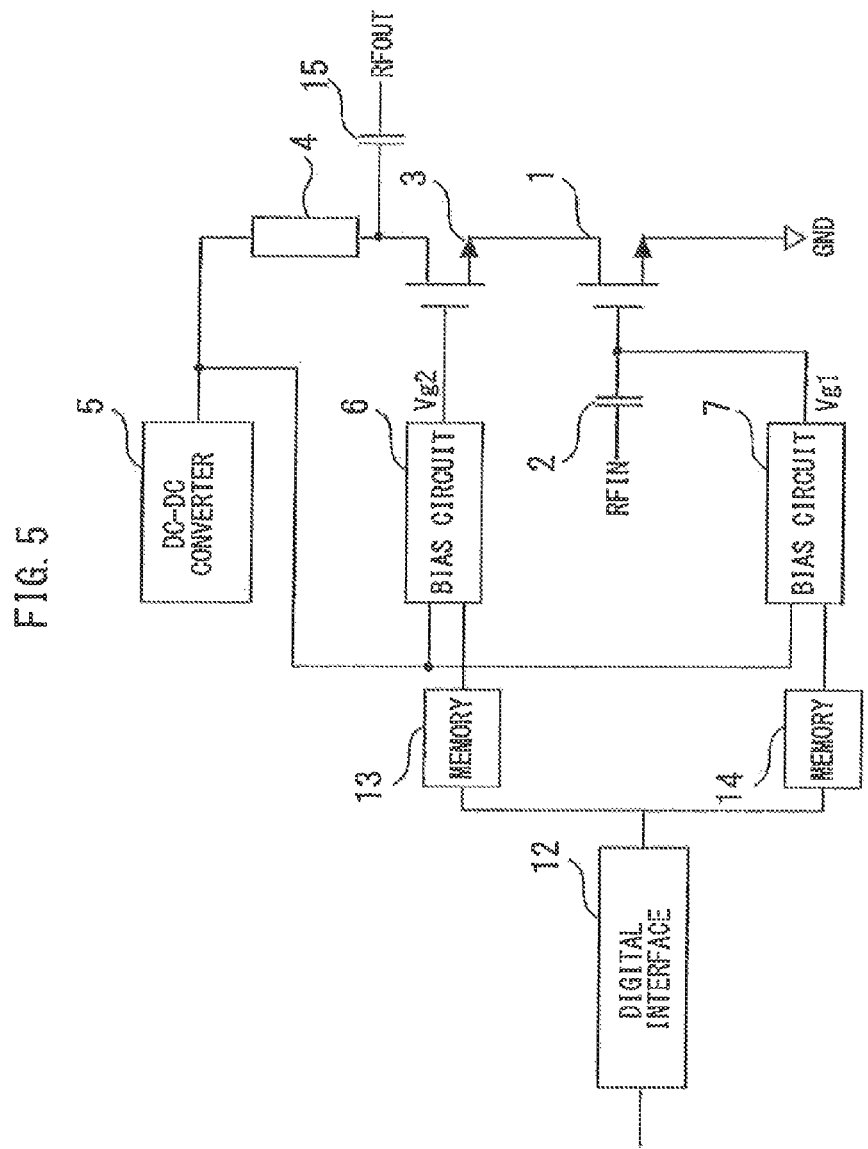
FIG. 5 is a diagram illustrating a cascode amplifier according to a third embodiment of the present invention.

FIG. 5 is a diagram illustrating a cascode amplifier according to a third embodiment of the present invention. A digital interface 12 receives a digital signal from outside and decodes the digital signal. Memories 13 and 14 store digital information inputted from outside. Functions of the bias circuits 6 and 7 are set according to digital information stored in the memories 13 and 14. This allows optimum conditions to be set for control conditions of the DC-DC converter 5 and bias conditions of the cascode amplifier which vary depending on differences in a modulation scheme or the like, making it possible to obtain excellent power added efficiency for various operation conditions.

Figure 6:
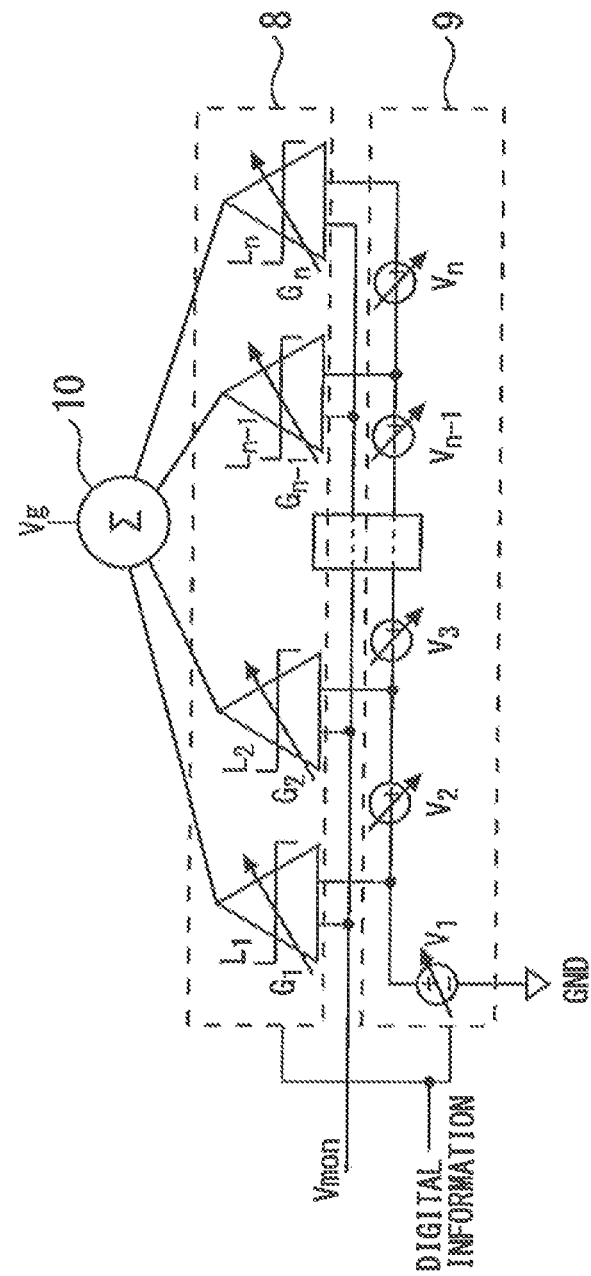
FIG. 6 is a diagram illustrating a bias circuit according to the third embodiment of the present invention.

FIG. 6 is a diagram illustrating a bias circuit according to the third embodiment of the present invention. A reference voltage Vi (i=1...n), a gain Gi (i=1...n), and a limiting level Li (i=1...n) of each of a plurality of limiter amplifiers 8 and a plurality of reference voltage sources 9 are variable and set according to digital information respectively. Therefore, any given output characteristics can be obtained depending on digital information from outside.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-259217, filed on Dec. 16, 2013, including specification, claims, drawings, and summary, on which the Convention priority of the present application is based, is incorporated herein by reference in its entirety.

What is claimed is:

1. A cascode amplifier comprising:
    a first transistor having a gate to which a signal is input, a grounded source, and a drain;
    a second transistor having a gate, a source connected to the drain of the first transistor, and a drain;
    a load connected to the drain of the second transistor;
    a DC-DC converter supplying a supply voltage, which is variable according to output power, to the drain of the second transistor via the load;
    a first bias circuit supplying a voltage, which is a function of the supply voltage, to the gate of the second transistor; and
    a second bias circuit supplying a voltage, which is a function of the supply voltage, to the gate of the first transistor, wherein output voltage of the second bias circuit decreases with an increase of the supply voltage.

2. A cascode amplifier according to claim 1, wherein output voltage of the first bias circuit increases with an increase of the supply voltage.

3. The cascode amplifier according to claim 1, wherein the first bias circuit limits drain voltage of the first transistor so as not to exceed a certain voltage.

4. The cascode amplifier according to claim 1, wherein the first bias circuit limits drain voltage of the first transistor so as not to fall below a certain voltage.

5. A cascode amplifier comprising:
a first transistor having a gate to which a signal is input, a grounded source, and a drain;
a second transistor having a gate, a source connected to the drain of the first transistor, and a drain;
a load connected to the drain of the second transistor;
a DC-DC converter supplying a supply voltage, which is variable according to output power, to the drain of the second transistor via the load; and
a first bias circuit supplying a voltage, which is a function of the supply voltage, to the gate of the second transistor, wherein the function relating the voltage supplied by the first bias circuit to the supply voltage changes according to an operating mode signal input from outside the cascode amplifier.

6. A cascode amplifier comprising:
a first transistor having a gate to which a signal is input, a grounded source, and a drain;
a second transistor having a gate, a source connected to the drain of the first transistor, and a drain;
a load connected to the drain of the second transistor;
a DC-DC converter supplying a supply voltage, which is variable according to output power, to the drain of the second transistor via the load;
a first bias circuit supplying a voltage, which is a function of the supply voltage, to the gate of the second transistor, wherein the first bias circuit includes
a plurality of limiter amplifiers, wherein
each limiter amplifier includes respective differential input terminals, and
the supply voltage is input to first terminals of the differential input terminals,
a plurality of reference voltage sources supplying reference voltages to second terminals of respective differential input terminals, and
an adder adding outputs of the limiter amplifiers.

7. The cascode amplifier according to claim 1, further comprising a low pass filter connected between an input of the first bias circuit and the drain of the second transistor.

8. A cascode amplifier comprising:
a first transistor having a gate to which a signal is input, a grounded source, and a drain;
a second transistor having a gate, a source connected to the drain of the first transistor, and a drain;
a load connected to the drain of the second transistor;
a DC-DC converter supplying a supply voltage, which is variable according to output power, to the drain of the second transistor via the load;
a first bias circuit supplying a voltage, which is a function of the supply voltage, to the gate of the second transistor; and
a memory storing digital information input from outside the cascode amplifier, wherein the function relating the voltage supplied by the first bias circuit to the supply voltage is set according to the digital information.

* * * * *